United States Patent
Tsu et al.

(10) Patent No.: US 7,724,034 B2
(45) Date of Patent: May 25, 2010

(54) FLOATING DRIVING CIRCUIT

(75) Inventors: Pei-Sheng Tsu, Shulin (TW); Ta-Yung Yang, Milpitas, CA (US)

(73) Assignee: System General Corp., Taipei Hsien (TW)

( * ) Notice: Subject to any disclaimer, the term of this patent is extended or adjusted under 35 U.S.C. 154(b) by 0 days.

(21) Appl. No.: 11/984,122

(22) Filed: Nov. 14, 2007

(65) Prior Publication Data

US 2008/0061827 A1 Mar. 13, 2008

Related U.S. Application Data

(62) Division of application No. 11/450,308, filed on Jun. 12, 2006.

(51) Int. Cl.
*H03K 19/0175* (2006.01)
(52) U.S. Cl. .............................. 326/82; 326/83; 326/86; 326/87
(58) Field of Classification Search ............. 326/82–83, 326/86–87; 327/108–109
See application file for complete search history.

(56) References Cited

U.S. PATENT DOCUMENTS

| 5,543,740 | A | * | 8/1996 | Wong | ........................... 327/108 |
| 2003/0007404 | A1 | * | 1/2003 | Yamauchi | ................... 365/205 |

* cited by examiner

*Primary Examiner*—James H. Cho
*Assistant Examiner*—Thienvu V Tran
(74) *Attorney, Agent, or Firm*—Rosenberg, Klein & Lee

(57) ABSTRACT

A floating driving circuit according to the present invention comprises an input circuit to receive an input signal. A latch circuit receives a trigger signal for generating a latch signal. The latch signal is used to turn on/off a switch. A coupling capacitor is connected between the input circuit and the latch circuit to generate the trigger signal in response to the input signal. A diode is connected from a voltage source to a floating supply terminal of the latch circuit for charging a capacitor. The capacitor is coupled between the floating supply terminal and a floating ground terminal of the latch circuit to provide a supply voltage to the latch circuit. The latch circuit is controlled by the input signal via the coupling capacitor.

3 Claims, 7 Drawing Sheets

FIG. 1 (Priort Art)

FLOATING DRIVING CIRCUIT

RELATED APPLICATIONS

This application is a Divisional patent application of copending application Ser. No. 11/450,308, filed on 12 Jun. 2006.

BACKGROUND OF THE INVENTION

1. Field of the Invention

The present invention relates to a driving circuit for a switch, and more particularly to a floating driving circuit for driving the switch.

2. Description of the Prior Art

A variety of power converters and motor drivers utilize bridge circuits to control power delivery from a power source to a load. The bridge circuit generally has a high-side switch coupled to the power source and a low-side switch coupled to a ground reference. A common node of the high-side switch and the low-side switch is coupled to the load. High-side and low-side switches are generally implemented with transistors. When high-side and low-side switches are controlled to alternately conduct, a voltage level at the common node swings between the power source and the ground reference. Therefore, the voltage level of the common node shifts to the power source when the high-side switch is turned on. In order to fully turn on the high-side switch to achieve low impedance, a gate driving voltage higher than the power source is required. Therefore, gate-to-source of the high-side switch must be floated with respect to the ground reference.

FIG. 1 shows a circuit diagram of a conventional bridge circuit having a bootstrap capacitor 44 and a charge-pump diode 40 to create a floating voltage $V_{CC}$ for driving a gate of a high-side switch 10. The high-side switch 10 receives an input voltage $V_{IN}$. When a controlling transistor 45 is turned on, the gate of the high-side switch 10 is connected to the ground reference via a diode 42. This will turn off the high-side switch 10. The controlling transistor 45 is controlled by an input signal $S_{IN}$ via an inverter 43. Once the high-side switch 10 is turned off and a low-side switch 20 is turned on, the bootstrap capacitor 44 will be charged up to the floating voltage $V_{CC}$ by a bias voltage $V_B$ via the charge-pump diode 40. The low-side switch 20 is coupled to the ground reference. Turning off the controlling transistor 45 will propagate the floating voltage $V_{CC}$ via a transistor 41 to the gate of the high-side switch 10. This turns on the high-side switch 10. A resistor 46 is coupled between the charge-pump diode 40 and the transistor 41.

One drawback of this circuit is its high switching losses in high-voltage applications. The controlling transistor 45 requires a high-voltage manufacturing process to be suitable for high-voltage applications (such as 200 volts or more). However, the parasitic capacitor of a high-voltage transistor is generally large, which will increase a rising time of a switching signal and therefore slow down the switching operation of the high-voltage transistor. This further causes high switching losses of the high-side switch 10. Therefore, this bridge circuit is inadequate for high-voltage and high-speed applications.

Many recently developed bridge circuit designs include methods of generating a suitable gate voltage for the high-side switch. Some well-known inventions include U.S. Pat. No. 5,381,044 (Zisa, Belluso, Paparo), U.S. Pat. No. 5,638,025 (Johnson), and U.S. Pat. No. 5,672,992 (Nadd). These bridge circuits share the same drawbacks as the circuit shown in FIG. 1. The controlling transistors of the aforementioned inventions cause high switching losses in high-voltage applications.

To overcome some of these disadvantages, a bridge circuit utilizing a boost converter technique has been introduced in U.S. Pat. No. 6,344,959 (Milazzo). However, this technique uses a voltage doubling circuit that requires an additional switching element as well as other circuitries, thereby increasing the cost and complexity of the driving circuit. Other prior arts such as U.S. Pat. No. 6,781,422 (Yang) and U.S. Pat. No. 6,836,173 (Yang) disclosed the high-side transistor driver for high-speed applications, but the higher power consumption is still the issue to be concerned.

An objective of the present invention is to overcome the drawbacks of prior arts. Another objective is to eliminate the need of high voltage controlling transistor (such as the controlling transistor 45) for providing a high efficiency driving circuit in high-voltage and high-speed applications.

SUMMARY OF THE INVENTION

A floating driving circuit according to the present invention comprises an input circuit to receive an input signal. A latch circuit is coupled to receive a trigger signal for generating a latch signal. The latch signal is used to drive a switch. A coupling capacitor is connected between the input circuit and the latch circuit to generate the trigger signal in response to the input signal. A diode is connected from a voltage source to a floating supply terminal of the latch circuit for charging a capacitor. The capacitor is coupled between the floating supply terminal and a floating ground terminal of the latch circuit to provide a supply voltage to the latch circuit. The latch circuit is controlled by the input signal via the coupling capacitor. A falling edge and a rising edge of the input signal determine the state of the latch circuit. The latch circuit will retain the state to turn on/off the switch. Therefore, no high voltage controlling transistor is needed.

The floating driving circuit introduces a method to drive the switch in high-voltage and high-speed applications. Moreover, the floating driving circuit provides a high efficiency switching operation for power saving.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention.

DESCRIPTION OF THE PREFERRED EMBODIMENTS

Figure 1:
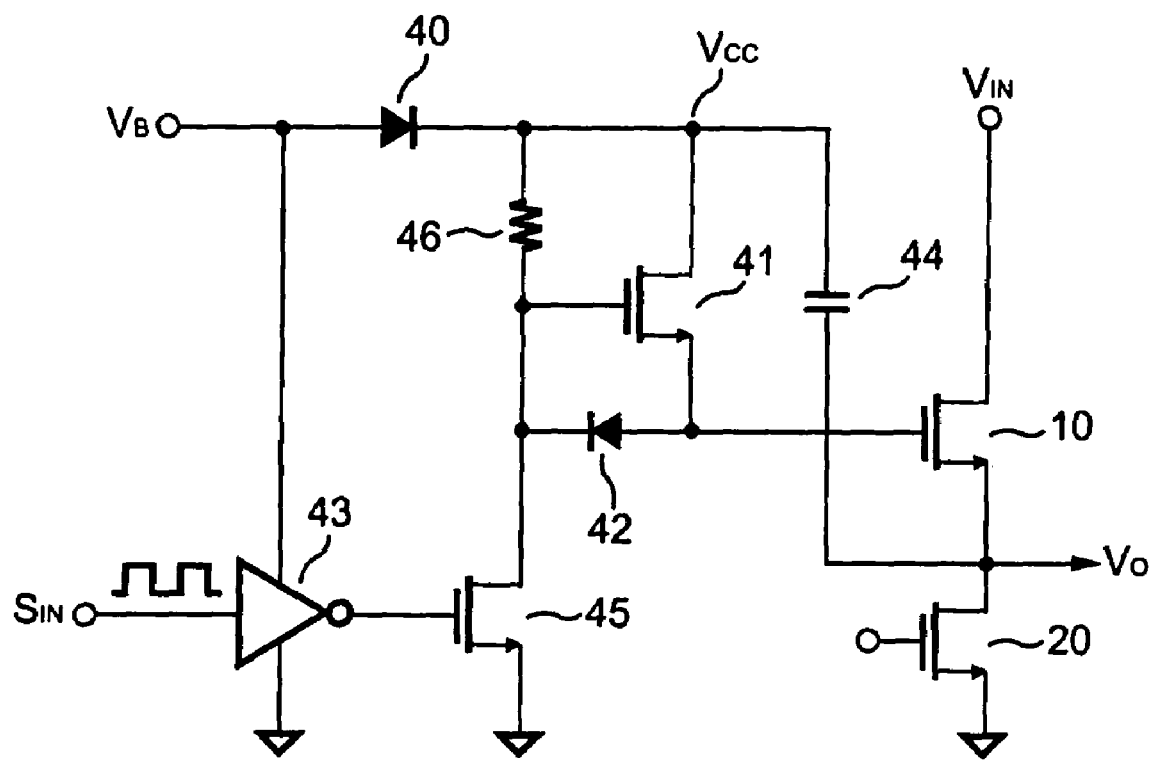
FIG. 1 shows a circuit diagram of a conventional bridge circuit.
Figure 2:
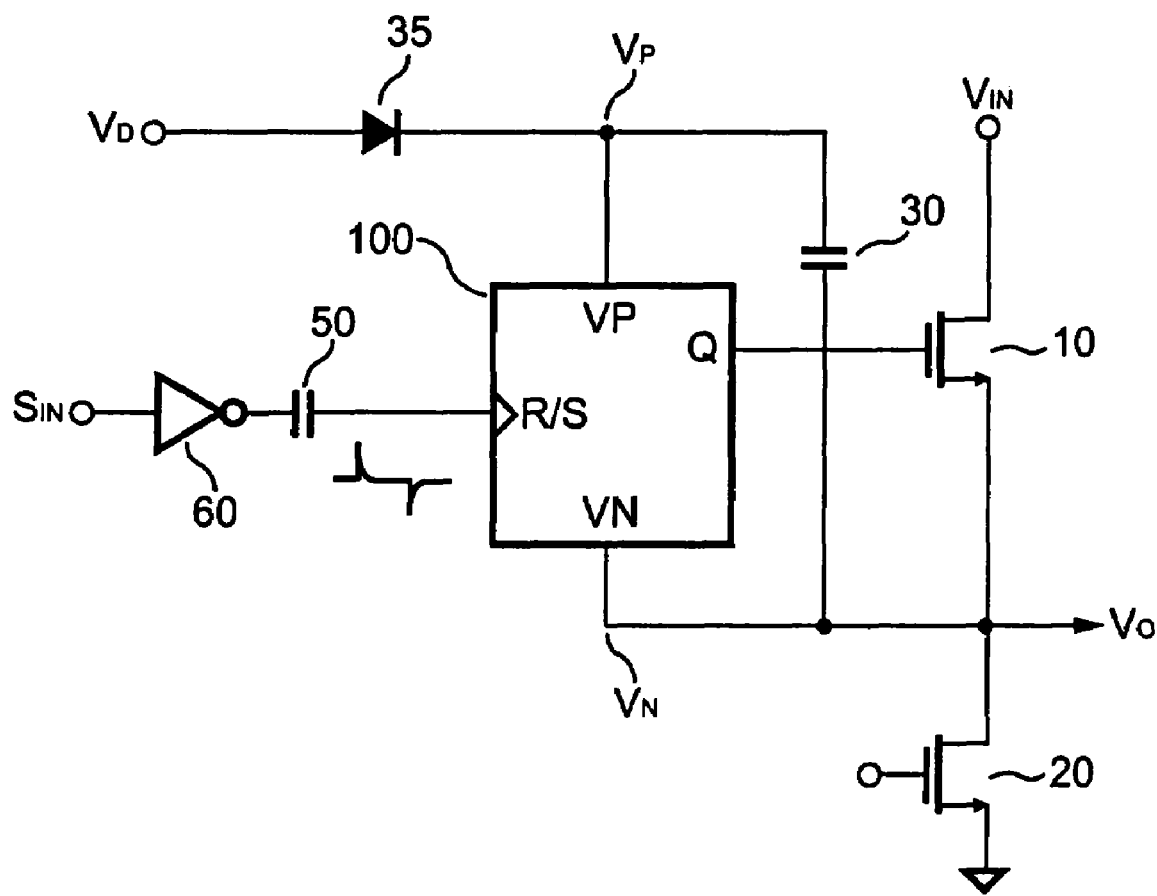
FIG. 2 shows a circuit diagram of a preferred embodiment of a floating driving circuit according to the present invention.

FIG. 2 shows a circuit diagram of a floating driving circuit according to an embodiment of the present invention. It comprises an input circuit 60 having an input terminal for receiving an input signal $S_{IN}$. The input circuit 60 operates as an inverter. An input terminal R/S of a latch circuit 100 receives a trigger signal. The latch circuit 100 further has an output terminal Q for generating a driving signal to drive a high-side switch 10. The high-side switch 10 receives an input voltage $V_{IN}$. Wherein the driving signal is a latch signal and the high-side switch 10 is implemented with a transistor. A low-side switch 20 is coupled between the high-side switch 10 and a ground reference.

A coupling capacitor 50 is coupled between an output terminal of the input circuit 60 and the input terminal R/S of the latch circuit 100 to generate the trigger signal in response to the input signal $S_{IN}$. The latch circuit 100 will change the state of the latch signal in response to the change of the trigger signal. That is, the state of the latch signal will change in response to the change of the input signal $S_{IN}$. A falling edge and a rising edge of the input signal $S_{IN}$ determine the state of the latch signal. The latch circuit 100 will retain the state to turn on/off the high-side switch 10. Therefore, no high-voltage controlling transistor is needed.

An isolation barrier or a high voltage would be produced between the input circuit 60 and the latch circuit 100. Therefore, the coupling capacitor 50 is required to be a high voltage capacitor to sustain the high voltage across the barrier. The latch circuit 100 includes a first terminal (floating supply terminal) VP and a second terminal (floating ground terminal) VN. The floating supply terminal VP and the floating ground terminal VN are used for receiving a supply voltage. The floating ground terminal VN is further connected to the high-side switch 10. A diode 35 is connected between a voltage source $V_D$ and the floating supply terminal VP. A capacitor 30 is coupled between the floating supply terminal VP and the floating ground terminal VN to store the energy for the latch circuit 100. The voltage source $V_D$ will charge the capacitor 30 to provide the supply voltage to the latch circuit 100 when the high-side switch 10 is turned off.

Figure 3:
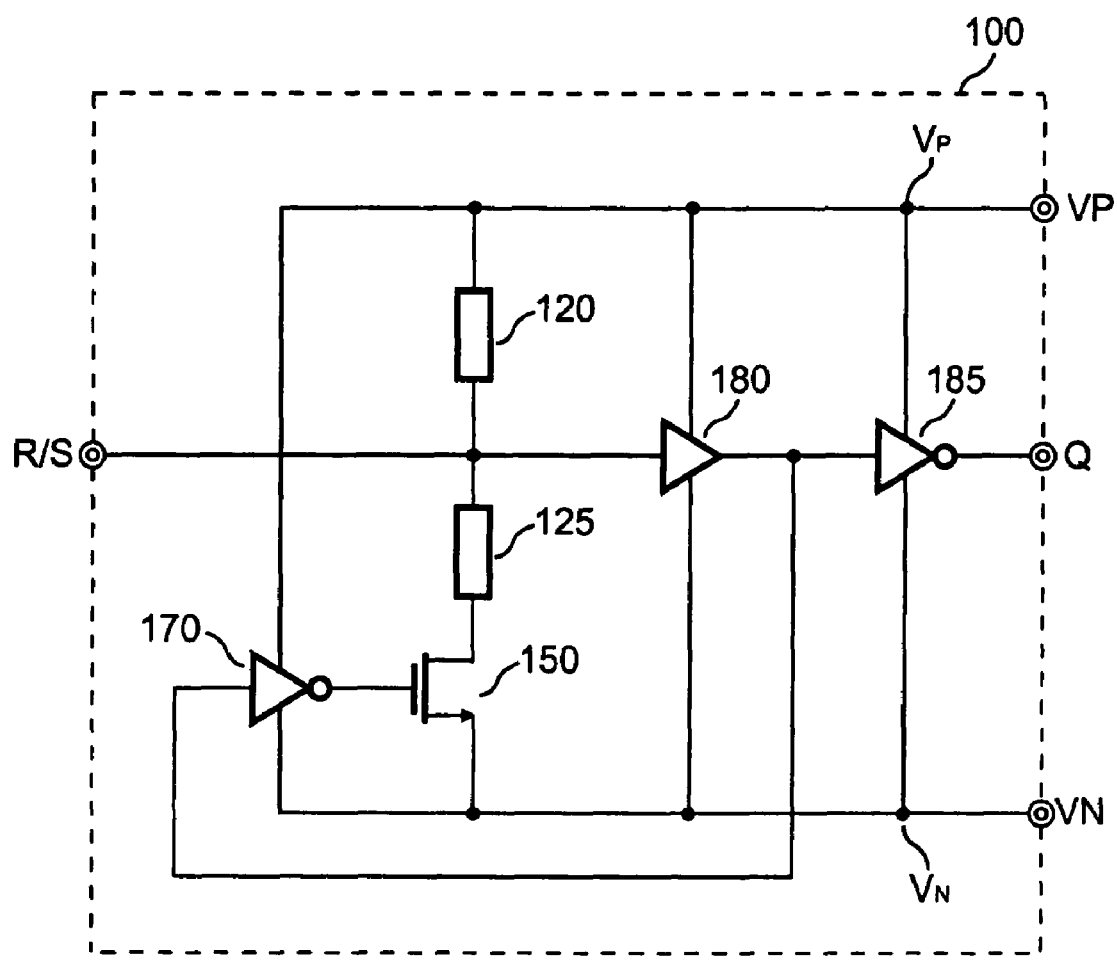
FIG. 3 shows a circuit diagram of an embodiment of a latch circuit according to the present invention.

FIG. 3 is an embodiment of the latch circuit 100. The latch circuit 100 operates as a switch driving circuit including a positive feedback. It comprises a buffer circuit 180, a first inverter circuit 185, a second inverter circuit 170, a latch transistor 150, a first resistive device 120 and a second resistive device 125. Resistive devices 120 and 125 can be implemented by resistors or transistors or current sources. An input terminal of the buffer circuit 180 is coupled to the input terminal R/S of the latch circuit 100 to receive the trigger signal. The first inverter circuit 185 has an input terminal connected to an output terminal of the buffer circuit 180 for generating the latch signal at an output terminal of the first inverter circuit 185. The output terminal of the first inverter circuit 185 is coupled to the output terminal Q of the latch circuit 100.

The first resistive device 120 is connected between the floating supply terminal VP and the input terminal R/S of the latch circuit 100. The second resistive device 125 is connected in series with the latch transistor 150. The second resistive device 125 is connected to the input terminal R/S of the latch circuit 100. The latch transistor 150 is connected to the floating ground terminal VN. An input terminal of the second inverter circuit 170 is coupled to the output terminal of the buffer circuit 180. An output terminal of the second inverter circuit 170 is coupled to the latch transistor 150 to control the latch transistor 150. The buffer circuit 180, the second inverter circuit 170, the latch transistor 150 and the second resistive device 125 form a positive feedback loop for the latch function.

Figure 4:
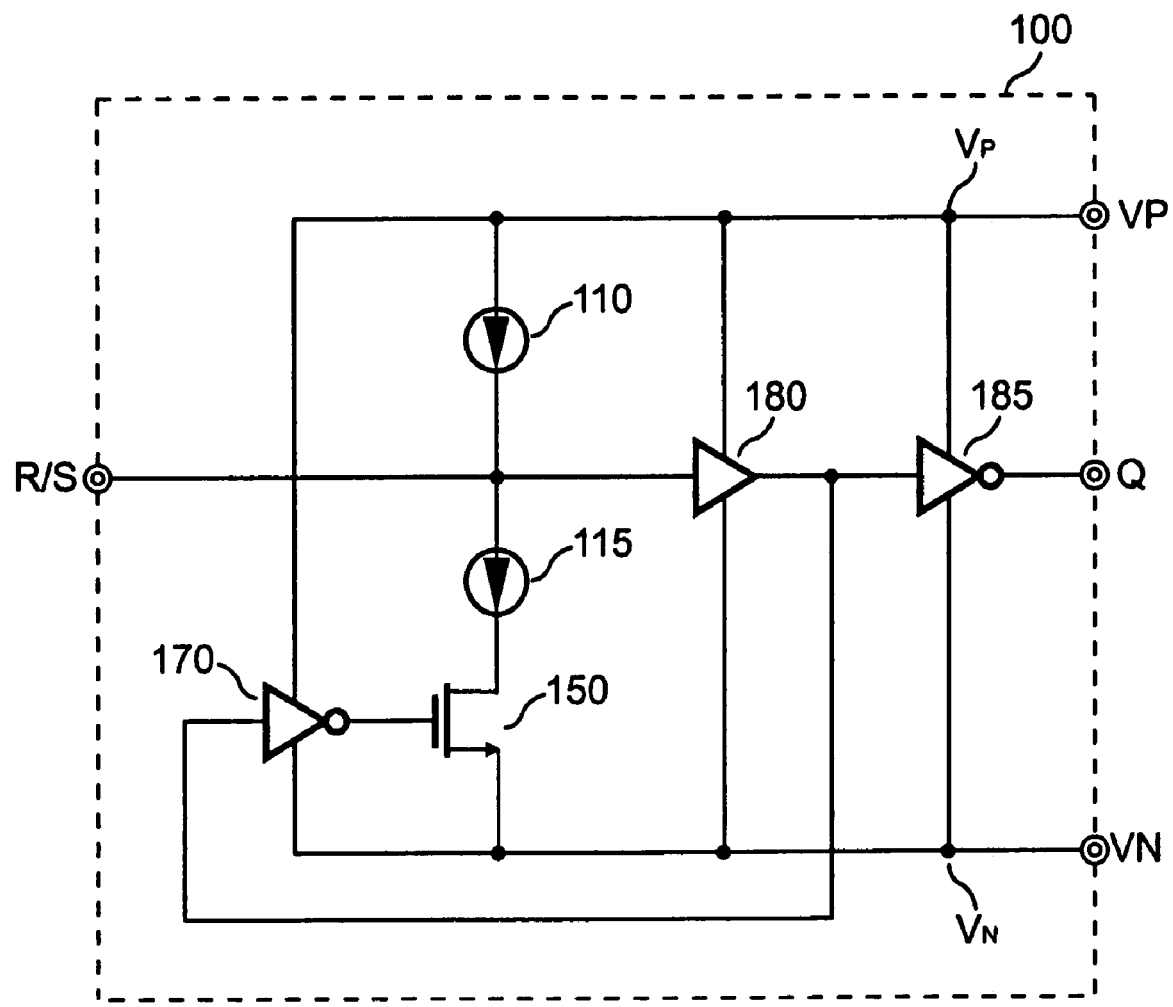
FIG. 4 shows a circuit diagram of another embodiment of the latch circuit according to the present invention.
Figure 5:
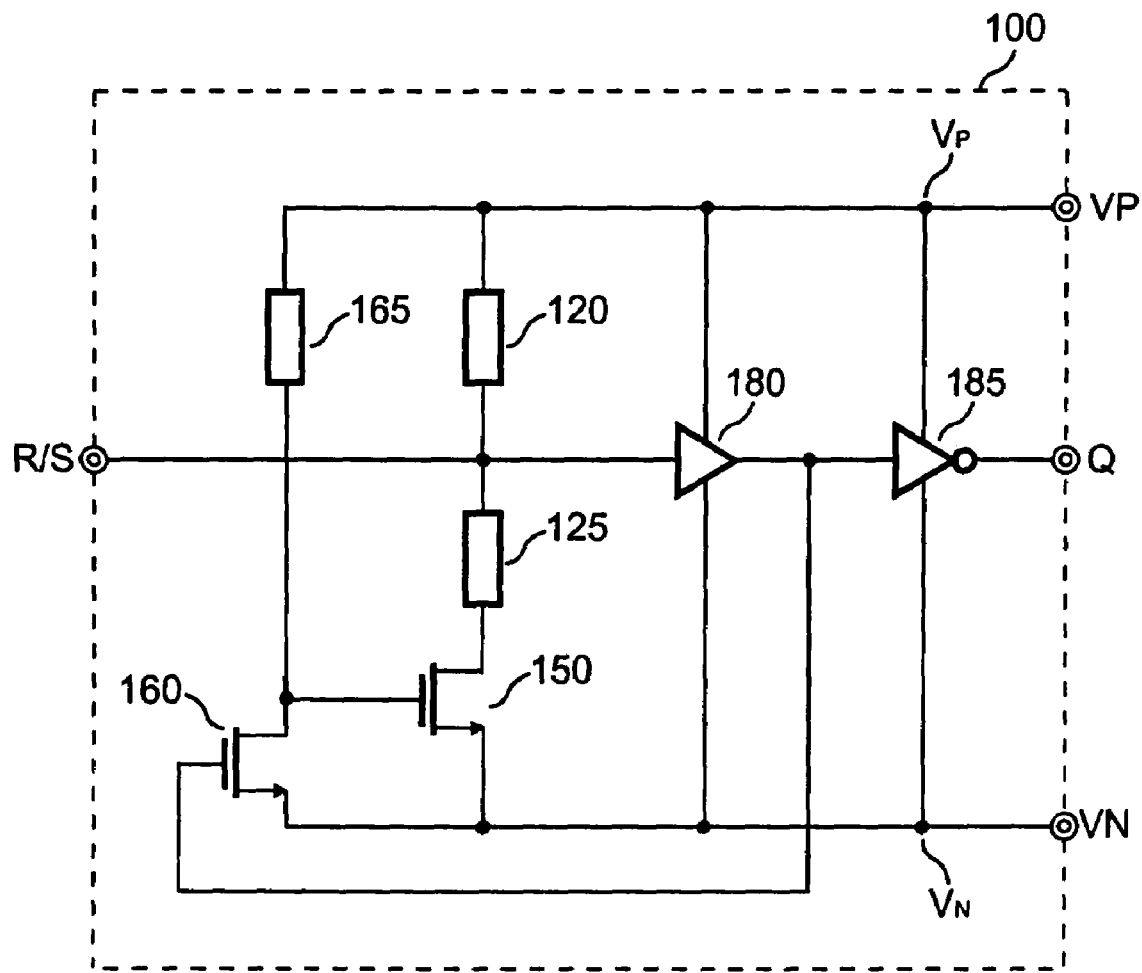
FIG. 5 shows a circuit diagram of another embodiment of the latch circuit according to the present invention.

FIG. 4 shows another embodiment of the latch circuit 100. The current sources 110 and 115 operate as resistive devices 120 and 125 shown in FIG. 3. FIG. 5 shows another embodiment of the latch circuit 100. A transistor 160 and a third resistive device 165 operate as the second inverter circuit 170 shown in FIG. 3. The transistor 160 and the third resistive device 165 are connected in series. The third resistive device 165 is further coupled to the floating supply terminal VP.

Figure 6:
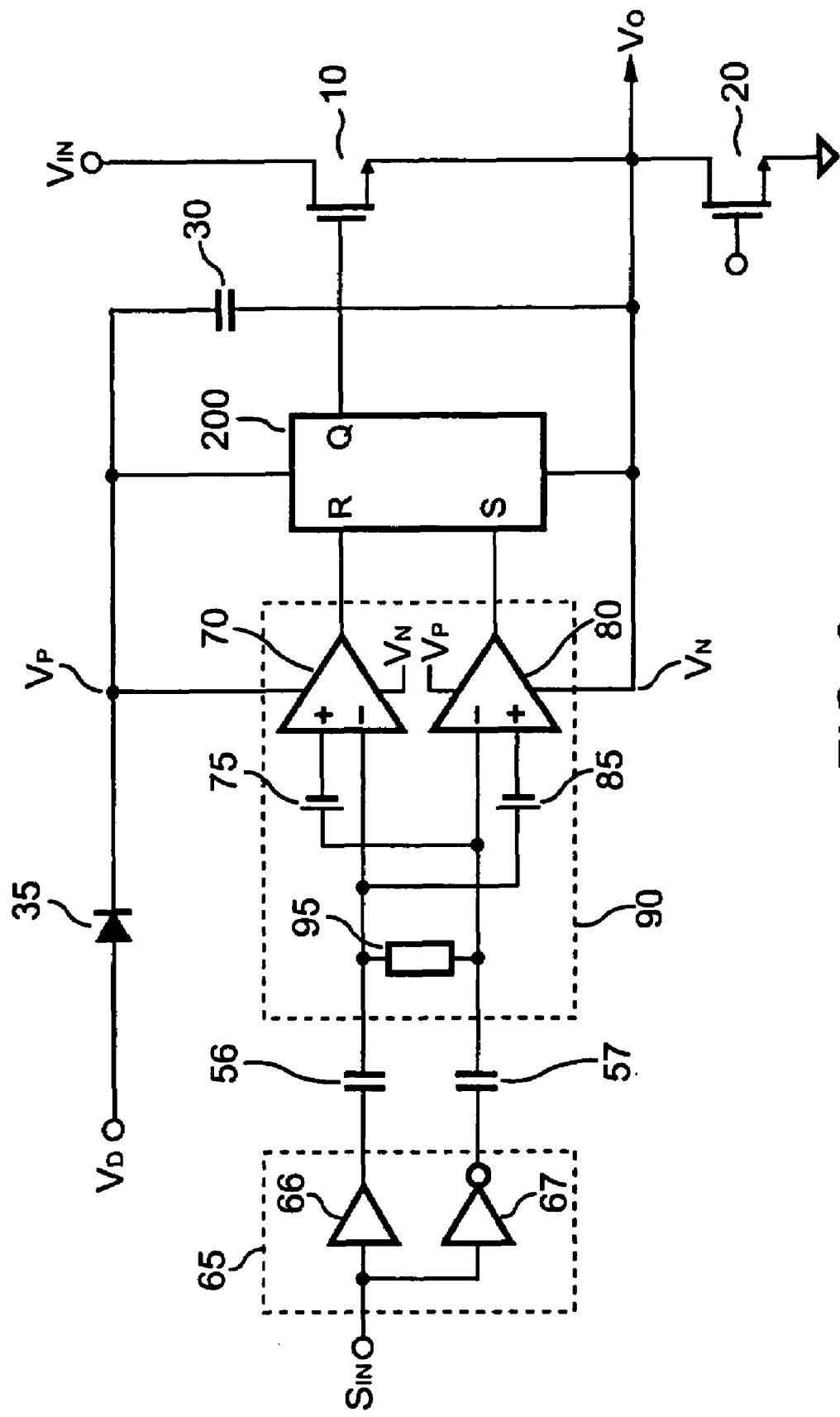
FIG. 6 shows a circuit diagram of an embodiment of a differential floating driving circuit according to the present invention.

In order to achieve better noise immunity, a differential floating driving circuit shown in FIG. 6 is developed according to the present invention. It comprises an input circuit 65 including a buffer 66 and an inverter 67 to receive the input signal $S_{IN}$. An input terminal of the buffer 66 and an input terminal of the inverter 67 are coupled together to receive the input signal $S_{IN}$. A floating differential circuit 90 comprises a first comparator 70, a second comparator 80 and a resistive device 95. The floating differential circuit 90 receives differential trigger signals for generating a set signal and a reset signal. A floating latch circuit 200 has a set terminal S and a reset terminal R to receive the set signal and the reset signal respectively for generating a latch signal at an output terminal Q of the floating latch circuit 200. The capacitor 30 is coupled to the floating latch circuit 200.

The floating latch circuit 200 has a positive feedback to change the latch state of the latch signal in response to the change of the differential trigger signals. The latch signal is used to control the high-side switch 10. Coupling capacitors 56 and 57 are coupled between the input circuit 65 and the floating differential circuit 90 to generate the differential trigger signals in response to the input signal $S_{IN}$. The coupling capacitor 56 is coupled between an output terminal of the buffer 66 of the input circuit 65 and an input terminal of the floating differential circuit 90. The coupling capacitor 57 is coupled between an output terminal of the inverter 67 of the input circuit 65 and another input terminal of the floating differential circuit 90. Because the differential trigger signals are generated in differential mode, a common mode noise cannot interrupt the operation of the differential floating driving circuit.

An output terminal of the first comparator 70, which is connected to the reset terminal R of the floating latch circuit 200, generates the reset signal. An output terminal of the second comparator 80, which is connected to the set terminal S of the floating latch circuit 200, generates the set signal. The resistive device 95 is coupled between negative input terminals of the comparator 70 and 80 to provide impedance for the termination. Negative input terminals of the comparator 70 and 80 are connected to the input terminals of the floating differential circuit 90. A positive input terminal of the first comparator 70 is connected to the negative input terminal of the second comparator 80 via a first threshold 75. A positive input terminal of the second comparator 80 is connected to the negative input terminal of the first comparator 70 via a second threshold 85. Therefore, the reset signal and the set signal can only be generated when the differential trigger signals are generated in differential mode. Besides, the amplitude of differential trigger signals must be higher than the first threshold or the second threshold for changing the state of the latch signal.

Figure 7:
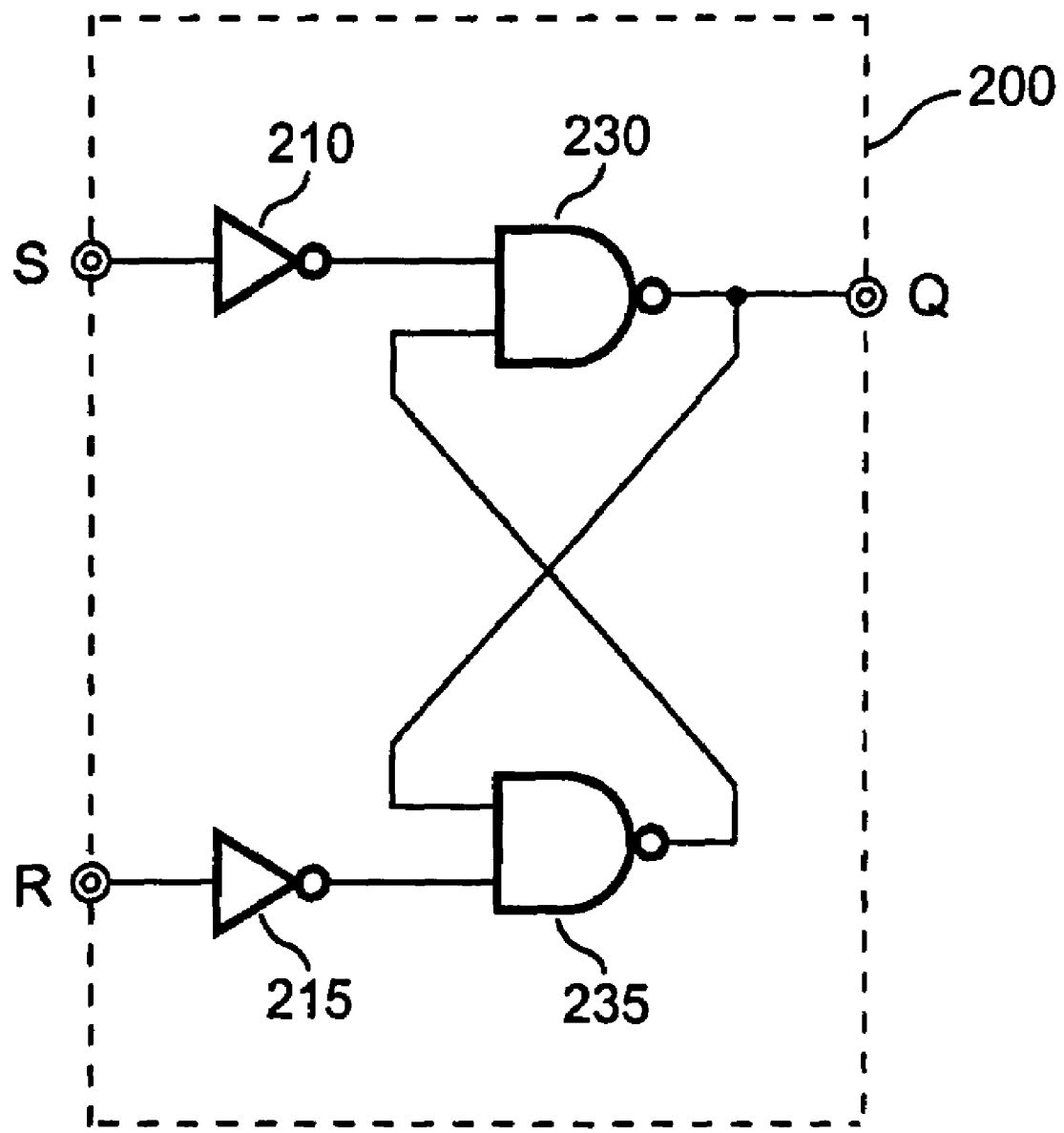
FIG. 7 shows a circuit diagram of an embodiment of a RS latch circuit according to the present invention.

FIG. 7 shows the floating latch circuit 200. It is a RS latch circuit including inverters 210, 215 and NAND gates 230, 235. An input terminal of the inverter 210 is connected to the set terminal S. An input terminal of the inverter 215 is connected to the reset terminal R. An output terminal of the inverter 210 is connected to an input terminal of the NAND gate 230. An output terminal of the inverter 215 is connected to an input terminal of the NAND gate 235. An output terminal of the NAND gate 230 generates the latch signal at the output terminal Q of the floating latch circuit 200. The output terminal of the NAND gate 230 is further connected to another input terminal of the NAND gate 235. An output terminal of the NAND gate 235 is connected to another input terminal of the NAND gate 230 to form the positive feedback for the latch operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims or their equivalents.

What is claimed is:

1. A differential floating driving circuit, comprising:
    an input circuit, for receiving an input signal;
    a floating differential circuit, for receiving differential trigger signals to generate a set signal and a reset signal;
    a floating latch circuit, coupled to said floating differential circuit to receive said set signal and said reset signal for generating a latch signal to turn on/off a switch; and
    coupling capacitors, coupled between said input circuit and said floating differential circuit to generate said differential trigger signals in response to said input signal wherein first terminals of said coupling capacitors are directly coupled to said input circuit and second terminals of said coupling capacitors are directly coupled to said floating differential circuit, said differential trigger signals generated in a differential mode;
    wherein said floating latch circuit changes a state of said latch signal in response to a change of said differential trigger signals.

2. The differential floating driving circuit as claimed in claim 1, wherein said floating latch circuit has a positive feedback.

3. The differential floating driving circuit as claimed in claim 1, wherein said floating differential circuit comprises:
    a first comparator, for generating said reset signal;
    a second comparator, for generating said set signal; and
    a resistive device, coupled between negative input terminals of said first comparator and said second comparator, wherein said negative input terminals of said first comparator and said second comparator are connected to input terminals of said floating differential circuit, a positive input terminal of said first comparator being connected to said negative input terminal of said second comparator via a first threshold, a positive input terminal of said second comparator being connected to said negative input terminal of said first comparator via a second threshold.

* * * * *